US012289914B2

(12) United States Patent
Yeh et al.

(10) Patent No.: US 12,289,914 B2
(45) Date of Patent: Apr. 29, 2025

(54) NITRIDE SEMICONDUCTOR DEVICE AND MANUFACTURING METHOD THEREOF

(71) Applicant: United Microelectronics Corp., Hsinchu (TW)

(72) Inventors: Chih Tung Yeh, Taoyuan (TW); Wen-Jung Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 486 days.

(21) Appl. No.: 17/381,989

(22) Filed: Jul. 21, 2021

(65) Prior Publication Data
US 2022/0393005 A1 Dec. 8, 2022

(30) Foreign Application Priority Data
Jun. 4, 2021 (CN) .......................... 202110622981.3

(51) Int. Cl.
| H10D 64/00 | (2025.01) |
| H01L 21/02 | (2006.01) |
| H10D 30/01 | (2025.01) |
| H10D 30/47 | (2025.01) |
| H10D 62/824 | (2025.01) |
| H10D 62/85 | (2025.01) |

(52) U.S. Cl.
CPC ..... H10D 64/118 (2025.01); H01L 21/02164 (2013.01); H01L 21/0217 (2013.01); H01L 21/02178 (2013.01); H10D 30/015 (2025.01); H10D 30/475 (2025.01); H10D 62/824 (2025.01); H10D 62/8503 (2025.01)

(58) Field of Classification Search
None
See application file for complete search history.

(56) References Cited

U.S. PATENT DOCUMENTS 9,419,121 B1* 8/2016 Teo ...................... H01L 29/7783
2013/0313609 A1* 11/2013 Akutsu ................ H01L 29/517
438/285

(Continued)

OTHER PUBLICATIONS

Tian-Li Wu et al., "Demonstration of Annealing-free Metal-Insulator-Semiconductor (MIS) Ohmic Contacts on a GaN Substrate using Low Work-function Metal Ytterbium (Yb) and Al2O3 Interfacial Layer," 2019 IEEE Workshop on Wide Bandgap Power Devices and Applications in Asia (WiPDA Asia), May 2019, pp. 1-4.

(Continued)

*Primary Examiner* — Khaja Ahmad
(74) *Attorney, Agent, or Firm* — J.C. PATENTS

(57) ABSTRACT

Provided are a nitride semiconductor device and a manufacturing method thereof. The nitride semiconductor device includes a substrate, a first nitride semiconductor layer, a second nitride semiconductor layer, a first metal layer, a second metal layer and a dielectric layer. The first nitride semiconductor layer is disposed on the substrate. The second nitride semiconductor layer is disposed on the first nitride semiconductor layer. The first metal layer is disposed in the second nitride semiconductor layer. The second metal layer is disposed on the second nitride semiconductor layer. The dielectric layer is disposed between the first metal layer and the second nitride semiconductor layer and/or between the second metal layer and the second nitride semiconductor layer.

18 Claims, 7 Drawing Sheets

(56) References Cited

U.S. PATENT DOCUMENTS

| | | | | |
|---|---|---|---|---|
| 2017/0148906 A1* | 5/2017 | Iucolano | ............... | H10D 64/256 |
| 2017/0148912 A1* | 5/2017 | Chu | ..................... | H10D 64/513 |
| 2017/0345922 A1* | 11/2017 | Iucolano | ............. | H01L 29/7786 |
| 2018/0158936 A1* | 6/2018 | Chen | ................... | H01L 29/7786 |
| 2021/0384339 A1* | 12/2021 | Sun | ..................... | H01L 29/2003 |

OTHER PUBLICATIONS

Hideki Hasegawa et al., "Current Transport, Fermi Level Pinning, and Transient Behavior of Group-III Nitride Schottky Barriers," Journal of the Korean Physical Society, vol. 55, Sep. 2009, pp. 1167-1179.

* cited by examiner

NITRIDE SEMICONDUCTOR DEVICE AND MANUFACTURING METHOD THEREOF

CROSS-REFERENCE TO RELATED APPLICATION

This application claims the priority benefit of China application serial no. 202110622981.3, filed on Jun. 4, 2021. The entirety of the above-mentioned patent application is hereby incorporated by reference herein and made a part of this specification.

BACKGROUND

Technical Field

The present invention relates to a semiconductor device and a manufacturing method thereof, and more particularly to a nitride semiconductor device and a manufacturing method thereof.

Description of Related Art

In order to enable semiconductor devices to have a low on-resistance, a high switching frequency, a high breakdown voltage and a high-temperature operation, gallium nitride (GaN) semiconductor devices are currently one of the most popular choices. In the process for manufacturing nitride semiconductor devices, the surface state of the GaN high electron mobility transistor (HEMT) is very critical. During the manufacturing process, any surface defects/damages may cause the occurrence of dangling bonds, which may have a significant impact on the efficiency of the formed device.

SUMMARY

The present invention provides a nitride semiconductor device in which a dielectric layer is disposed between a metal layer and a nitride semiconductor layer.

The present invention provides a manufacturing method of a nitride semiconductor device, wherein a dielectric layer is formed between a metal layer and a nitride semiconductor layer.

A nitride semiconductor device of the present invention includes a substrate, a first nitride semiconductor layer, a second nitride semiconductor layer, a first metal layer, a second metal layer and a dielectric layer. The first nitride semiconductor layer is disposed on the substrate. The second nitride semiconductor layer is disposed on the first nitride semiconductor layer. The first metal layer is disposed in the second nitride semiconductor layer. The second metal layer is disposed on the second nitride semiconductor layer. The dielectric layer is disposed between the first metal layer and the second nitride semiconductor layer and/or between the second metal layer and the second nitride semiconductor layer.

In an embodiment of the nitride semiconductor device of the present invention, the thickness of the dielectric layer does not exceed 2 nm.

In an embodiment of the nitride semiconductor device of the present invention, the material of the dielectric layer includes $Al_2O_3$, SiN, $SiO_2$ or a combination thereof.

In an embodiment of the nitride semiconductor device of the present invention, the material of the first metal layer includes Ti, Al or a combination thereof.

In an embodiment of the nitride semiconductor device of the present invention, the material of the second metal layer includes TiN, Au, Ni or a combination thereof.

In an embodiment of the nitride semiconductor device of the present invention, the material of the first nitride semiconductor layer includes GaN.

In an embodiment of the nitride semiconductor device of the present invention, the material of the second nitride semiconductor layer includes AlGaN.

In an embodiment of the nitride semiconductor device of the present invention, a third nitride semiconductor layer is further disposed between the dielectric layer and the second nitride semiconductor layer and located below the second metal layer.

In an embodiment of the nitride semiconductor device of the present invention, the material of the third nitride semiconductor layer includes doped GaN.

In an embodiment of the nitride semiconductor device of the present invention, the bottom surface of the first metal layer is located in the first nitride semiconductor layer or at the interface between the first nitride semiconductor layer and the second nitride semiconductor layer, and the dielectric layer is further located between the first metal layer and the first nitride semiconductor layer.

A manufacturing method of a nitride semiconductor device of the present invention includes the following steps. A first nitride semiconductor layer is formed on a substrate. A second nitride semiconductor layer is formed on the first nitride semiconductor layer. A trench is formed in the second nitride semiconductor layer. A dielectric layer is formed on the bottom surface and the sidewall of the trench and/or on the top surface of the second nitride semiconductor layer. A first metal layer is formed in the trench. A second metal layer is formed on the top surface of the second nitride semiconductor layer.

In an embodiment of the manufacturing method of the nitride semiconductor device of the present invention, the thickness of the dielectric layer does not exceed 2 nm.

In an embodiment of the manufacturing method of the nitride semiconductor device of the present invention, the material of the dielectric layer includes $Al_2O_3$, SiN, $SiO_2$ or a combination thereof.

In an embodiment of the manufacturing method of the nitride semiconductor device of the present invention, the material of the first metal layer includes Ti, Al or a combination thereof.

In an embodiment of the manufacturing method of the nitride semiconductor device of the present invention, the material of the second metal layer includes TiN, Au, Ni or a combination thereof.

In an embodiment of the manufacturing method of the nitride semiconductor device of the present invention, the material of the first nitride semiconductor layer includes GaN.

In an embodiment of the manufacturing method of the nitride semiconductor device of the present invention, the material of the second nitride semiconductor layer includes AlGaN.

In an embodiment of the manufacturing method of the nitride semiconductor device of the present invention, a third nitride semiconductor layer is further formed on the top surface of the second nitride semiconductor layer after forming the second nitride semiconductor layer and before forming the dielectric layer.

In an embodiment of the manufacturing method of the nitride semiconductor device of the present invention, the material of the third nitride semiconductor layer includes doped GaN.

In an embodiment of the manufacturing method of the nitride semiconductor device of the present invention, the bottom surface of the trench is located in the first nitride semiconductor layer or at the interface between the first nitride semiconductor layer and the second nitride semiconductor layer.

Based on the above, in the present invention, a dielectric layer is disposed between a metal layer and a nitride semiconductor layer, so that the metal layer and the nitride semiconductor layer may have a good ohmic contact and/or Schottky contact.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
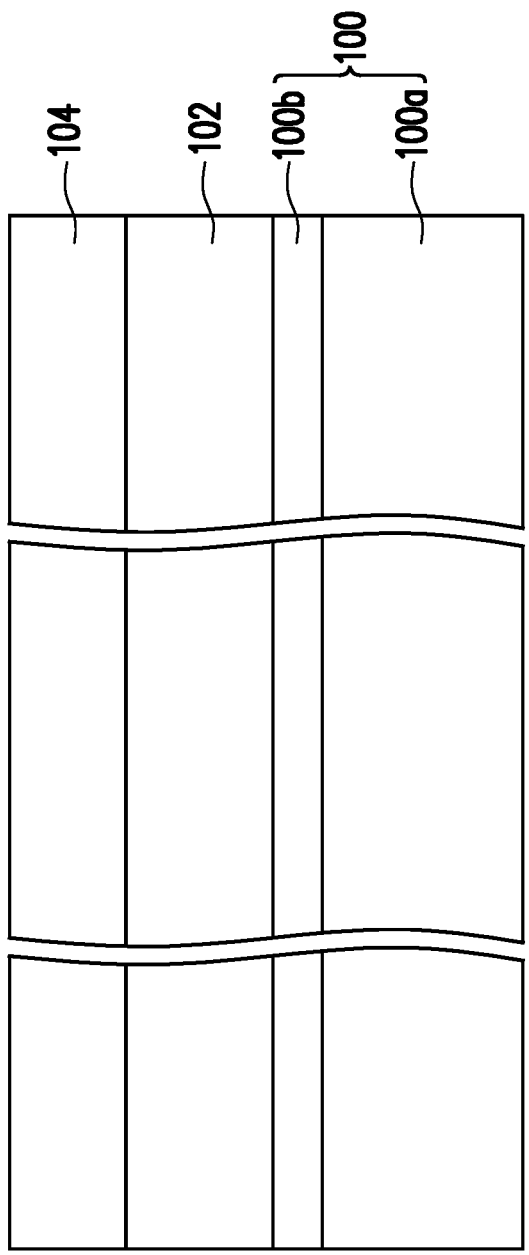
FIGS. 1A to 1C are schematic cross-sectional views of the manufacturing process of a nitride semiconductor device according to a first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

Figure 1B:
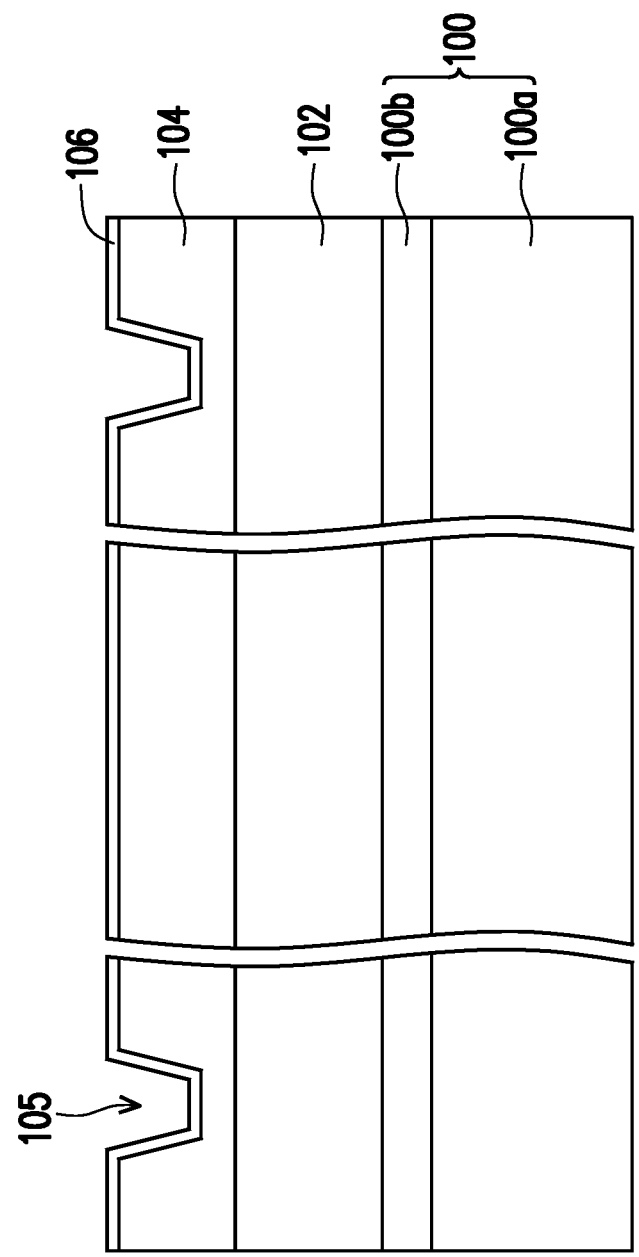
Figure 1C:
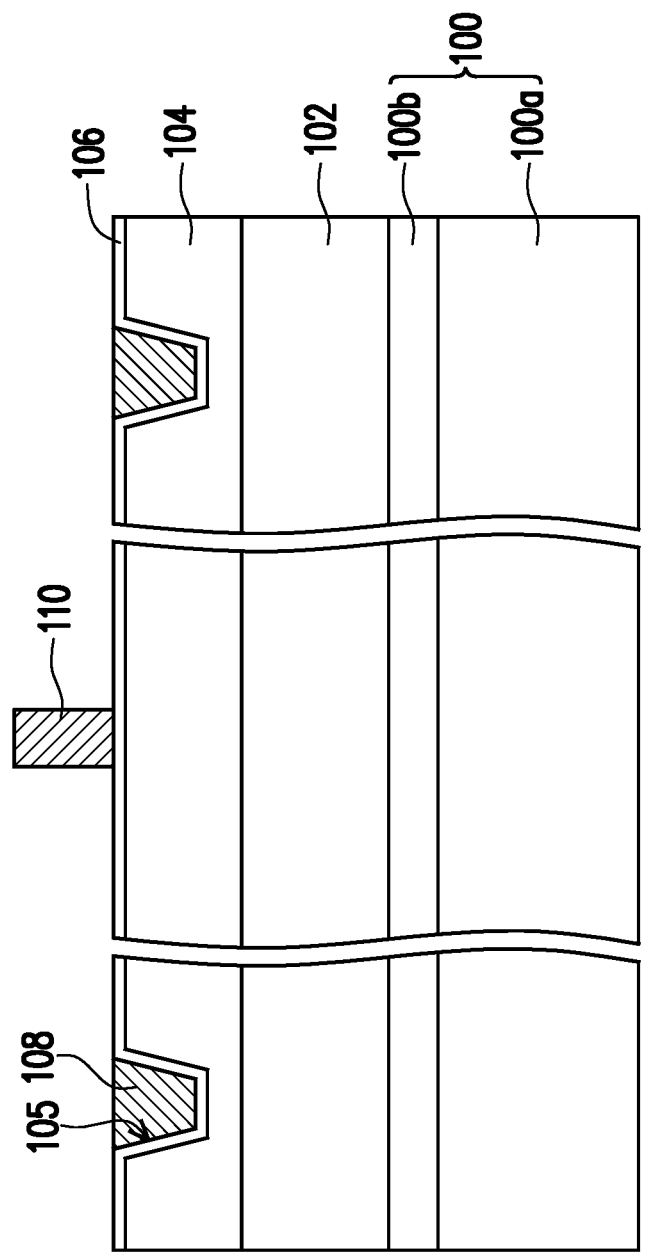

FIGS. 1A to 1C are schematic cross-sectional views of the manufacturing process of a nitride semiconductor device according to a first embodiment of the present invention.

Referring to FIG. 1A, a substrate 100 is provided. In the present embodiment, the substrate 100 includes a base 100a and a nucleation layer 100b formed on the base 100a, but the present invention is not limited thereto. The substrate 100 is, for example, a silicon (Si) substrate, a silicon carbide (SiC) substrate, a sapphire substrate or a gallium nitride (GaN) substrate. The material of the nucleation layer 100b is, for example, a Group III-V semiconductor material, such as AlN, GaN, AlGaN or a combination thereof. Then, a first nitride semiconductor layer 102 is formed on the substrate 100. The material of the first nitride semiconductor layer 102 is, for example, a Group III-V semiconductor material, such as GaN. When the nitride semiconductor device to be formed is a transistor, the first nitride semiconductor layer 102 may be used as a channel layer in the transistor. Next, a second nitride semiconductor layer 104 is formed on the first nitride semiconductor layer 102. The material of the second nitride semiconductor layer 104 is, for example, a Group III-V semiconductor material, such as AlGaN. When the nitride semiconductor device to be formed is a transistor, the second nitride semiconductor layer 104 may be used as a barrier layer in the transistor.

Referring to FIG. 1B, a trench 105 is formed in the second nitride semiconductor layer 104. In the present embodiment, the bottom surface of the trench 105 is located in the second nitride semiconductor layer 104. Next, a dielectric layer 106 is formed on the bottom surface and the sidewall of the trench 105 and the top surface of the second nitride semiconductor layer 104. In other words, the dielectric layer 106 is conformally formed on the second nitride semiconductor layer 104. The material of the dielectric layer 106 is, for example, $Al_2O_3$, SiN, $SiO_2$ or a combination thereof. The method for forming the dielectric layer 106 is, for example, a chemical vapor deposition (CVD) process or an atomic layer deposition (ALD) process. The thickness of the dielectric layer 106 does not exceed 2 nm, for example. For example, when the material of the dielectric layer 106 is $Al_2O_3$, the thickness of the dielectric layer 106 does not exceed 1 nm, for example; when the material of the dielectric layer 106 is SiN, the thickness of the dielectric layer 106 is, for example, between 1.5 nm and 2 nm; when the material of the dielectric layer 106 is $SiO_2$, the thickness of the dielectric layer 106 is, for example, between 1 nm and 2 nm.

Generally, the trench 105 is formed by an etching process. Therefore, after the trench 105 is formed by the etching process, the surface of the trench 105 may have defects/damages. In the present embodiment, after the trench 105 is formed, the dielectric layer 106 is formed on the surface of the trench 105 to repair defects/damages at the surface of the trench 105, so that the sidewall and the bottom of the trench 105 may have a smooth surface. In this way, the occurrence of dangling bonds may be effectively reduced (or even avoided), and the performance of the formed nitride semiconductor device may be maintained.

Referring to FIG. 1C, a first metal layer 108 is formed on the dielectric layer 106 in the trench 105, and a second metal layer 110 is formed on the dielectric layer 106 on the top surface of the second nitride semiconductor layer 104.

The material of the first metal layer 108 is, for example, Ti, Al or a combination thereof. The method for forming the first metal layer 108 includes the following steps, for example. A metal material layer is formed on the dielectric layer 106 and filling the trench 105. The metal material layer is patterned. When the nitride semiconductor device to be formed is a transistor, the first metal layer 108 may be used as the source/drain regions in the transistor. In the present embodiment, since the thickness of the dielectric layer 106 does not exceed 2 nm, the ohmic contact may be formed between the first metal layer 108 and the second nitride semiconductor layer 104. In addition, since the dielectric layer 106 covers the surface of the trench 105, the sidewall and the bottom of the trench 105 may have a smooth surface, that is, there are no defects/damages at the sidewall and the bottom of the trench 105. As a result, the occurrence of dangling bonds may be effectively reduced (even avoided), which may improve the ohmic contact between the first metal layer 108 and the second nitride semiconductor layer 104.

The material of the second metal layer 110 includes TiN, Au, Ni or a combination thereof. The method for forming the second metal layer 110 includes the following steps, for example. A metal material layer is formed on the dielectric layer 106. The metal material layer is patterned. When the nitride semiconductor device to be formed is a transistor, the second metal layer 110 may be used as the gate in the transistor. The second metal layer 110 may be formed after the formation of the first metal layer 108. Alternatively, the second metal layer 110 may be formed before the formation of the first metal layer 108. In the present embodiment, since the thickness of the dielectric layer 106 does not exceed 2 nm, the schottky contact may be formed between the second metal layer 110 and the second nitride semiconductor layer 104. In addition, since the dielectric layer 106 covers on the second nitride semiconductor layer 104, the top surface of the second nitride semiconductor layer 104 may have a smooth surface, that is, there are no defects/damages at the top surface of the second nitride semiconductor layer 104. As a result, the occurrence of dangling bonds may be effectively reduced (even avoided), which may improve the Schottky contact between the second metal layer 110 and the second nitride semiconductor layer 104.

Hereinafter, the nitride semiconductor device of the present invention will be described by taking FIG. 1C as an example. Referring to FIG. 1C, in the present embodiment, the nitride semiconductor device of the present invention includes the substrate 100, the first nitride semiconductor layer 102, the second nitride semiconductor layer 104, the dielectric layer 106, the first metal layer 108 and the second metal layer 110. The first nitride semiconductor layer 102 is disposed on the substrate 100. The second nitride semiconductor layer 104 is disposed on the first nitride semiconductor layer 102. The first metal layer 108 is disposed in the second nitride semiconductor layer 104, and the bottom surface of the first metal layer 108 is located in the second nitride semiconductor layer 104. The second metal layer 110 is disposed on the second nitride semiconductor layer 104. The dielectric layer 106 is disposed between the first metal layer 108 and the second nitride semiconductor layer 104, and disposed between the second metal layer 110 and the second nitride semiconductor layer 104. Since the thickness of the dielectric layer 106 does not exceed 2 nm and the surface of the second nitride semiconductor layer 104 may be free of defects/damages by the dielectric layer 106, a good ohmic contact may be formed between the first metal layer 108 and the second nitride semiconductor layer 104, and a good Schottky contact may be formed between the second metal layer 110 and the second nitride semiconductor layer 104.

Figure 2:
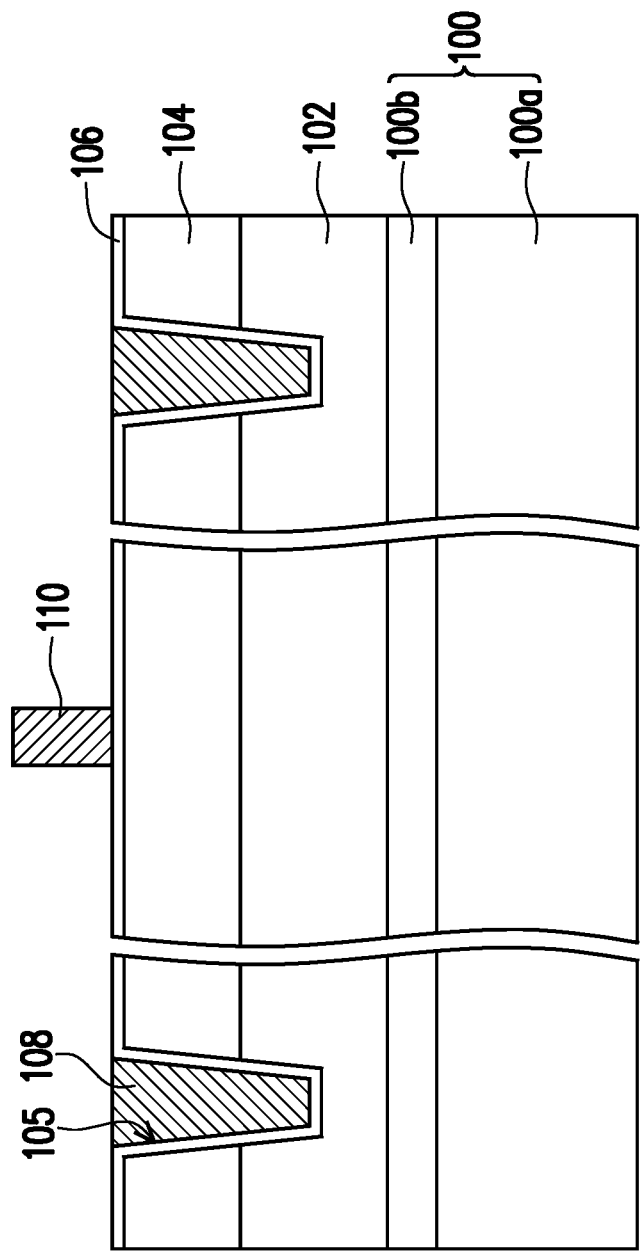
FIG. 2 is a schematic cross-sectional view of a nitride semiconductor device according to a second embodiment of the present invention.

FIG. 2 is a schematic cross-sectional view of a nitride semiconductor device according to a second embodiment of the present invention. In the present embodiment, the same components as those in the first embodiment will be represented by the same reference numbers, and the description thereof will not be repeated.

Referring FIG. 2, the difference between the present embodiment and the first embodiment is that in the present embodiment, during the formation of the trench 105, the trench 105 is extended from the top surface of the second nitride semiconductor layer 104 into the first nitride semiconductor layer 102. As a result, in addition to being formed in the second nitride semiconductor layer 104, the first metal layer 108 is also extended downward into the first nitride semiconductor layer 102. Therefore, in the present embodiment, the bottom surface of the first metal layer 108 is located in the first nitride semiconductor layer 102. In addition, the dielectric layer 106 is located between the first metal layer 108 and the first nitride semiconductor layer 102, and between the first metal layer 108 and the second nitride semiconductor layer 104.

Figure 3:
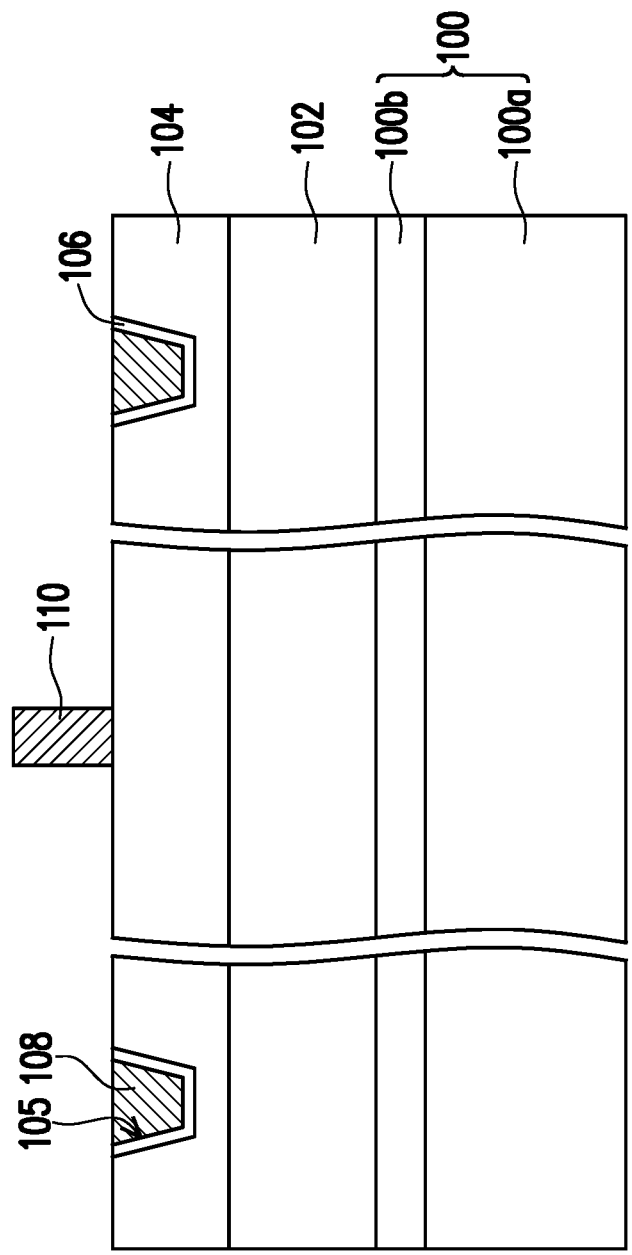
FIG. 3 is a schematic cross-sectional view of a nitride semiconductor device according to a third embodiment of the present invention.

FIG. 3 is a schematic cross-sectional view of a nitride semiconductor device according to a third embodiment of the present invention. In the present embodiment, the same components as those in the first embodiment will be represented by the same reference numbers, and the description thereof will not be repeated.

Referring to FIG. 3, the difference between the present embodiment and the first embodiment is that in the present embodiment, after the dielectric layer 106 is conformally formed on the second nitride semiconductor layer 104, a part of the dielectric layer 106 is removed, and the dielectric layer 106 in the trench 105 is retained. As a result, the second metal layer 110 may be directly formed on the top surface of the second nitride semiconductor layer 104. In the present embodiment, since the thickness of the dielectric layer 106 does not exceed 2 nm and the surface of the second nitride semiconductor layer 104 may be free of defects/damages by the dielectric layer 106, a good ohmic contact may be formed between the first metal layer 108 and the second nitride semiconductor layer 104.

Figure 4:
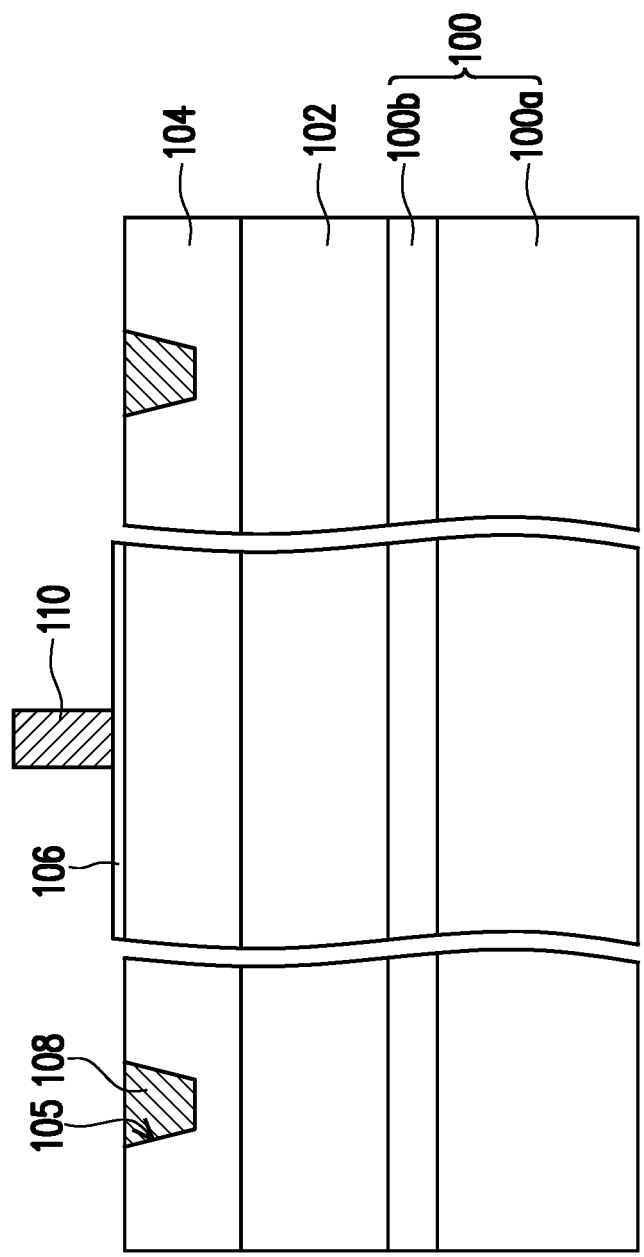
FIG. 4 is a schematic cross-sectional view of a nitride semiconductor device according to a fourth embodiment of the present invention.

FIG. 4 is a schematic cross-sectional view of a nitride semiconductor device according to a fourth embodiment of the present invention. In the present embodiment, the same components as those in the first embodiment will be represented by the same reference numbers, and the description thereof will not be repeated.

Referring to FIG. 4, the difference between the present embodiment and the first embodiment is that in the present embodiment, after the dielectric layer 106 is conformally formed on the second nitride semiconductor layer 104, a part of the dielectric layer 106 is removed, and the dielectric layer 106 in a region where the second metal layer 110 is to be formed is retained. As a result, the second metal layer 110 may be formed on the dielectric layer 106 on the top surface of the second nitride semiconductor layer 104, and the first metal layer 108 is formed in the trench 105 to directly contact with the second nitride semiconductor layer 104. In the present embodiment, since the thickness of the dielectric layer 106 does not exceed 2 nm and the surface of the second nitride semiconductor layer 104 may be free of defects/damages by the dielectric layer 106, a good Schottky contact may be formed between the second metal layer 110 and the second nitride semiconductor layer 104.

Figure 5:
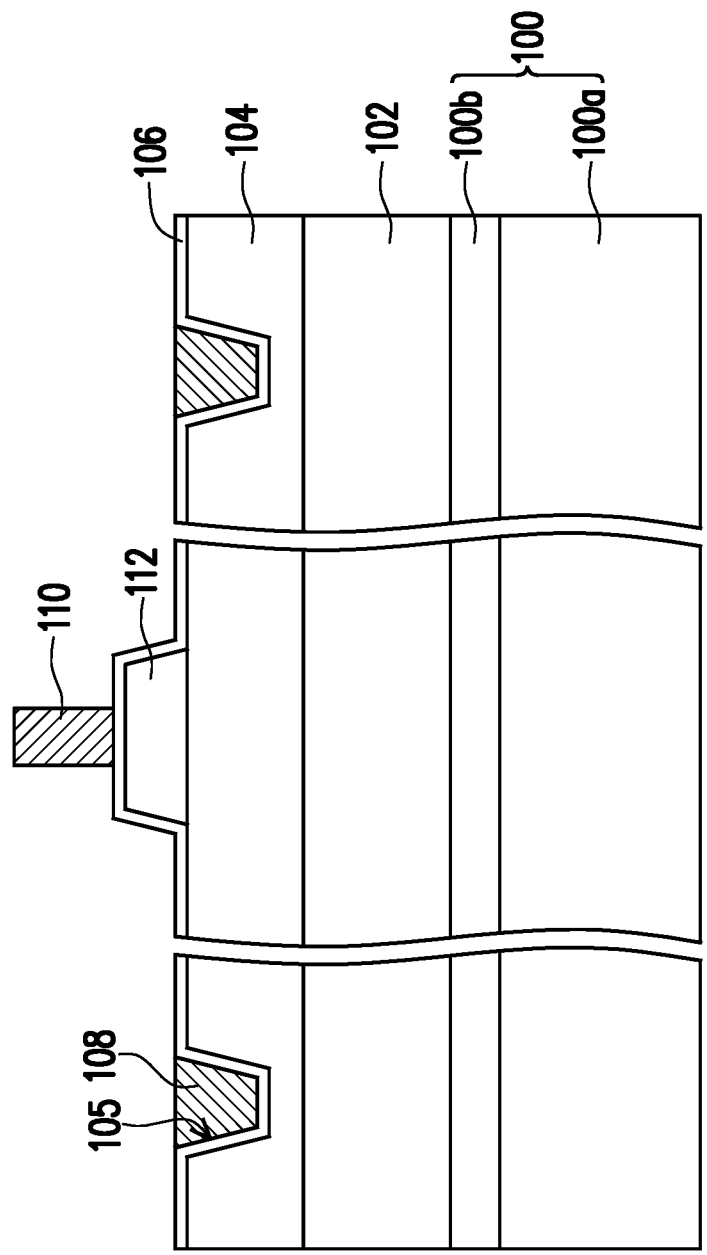
FIG. 5 is a schematic cross-sectional view of a nitride semiconductor device according to a fifth embodiment of the present invention.

FIG. 5 is a schematic cross-sectional view of a nitride semiconductor device according to a fifth embodiment of the present invention. In the present embodiment, the same components as those in the first embodiment will be represented by the same reference numbers, and the description thereof will not be repeated.

Referring to FIG. 5, the difference between the present embodiment and the first embodiment is that in the present embodiment, after the trench 105 is formed and before the dielectric layer 106 is formed, a third nitride semiconductor layer 112 is formed on the top surface of the second nitride semiconductor layer 104. The material of the third nitride semiconductor layer 112 is, for example, doped GaN. In the present embodiment, the material of the third nitride semiconductor layer 112 may be GaN doped with p-type dopants, but the present invention is not limited thereto. After that, the dielectric layer 106 is formed, and the dielectric layer 106 covers the third nitride semiconductor layer 112. In other words, in the present embodiment, the third nitride semiconductor layer 112 is disposed between the dielectric layer 106 and the second nitride semiconductor layer 104, and located below the second metal layer 110.

In addition, in another embodiment, after the second nitride semiconductor layer 104 is formed, the third nitride semiconductor layer 112 may be formed, and then the trench 105 may be formed.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A nitride semiconductor device, comprising:
a substrate;
a first nitride semiconductor layer, disposed on the substrate;
a second nitride semiconductor layer, disposed on the first nitride semiconductor layer;
a first metal layer, disposed in the second nitride semiconductor layer;
a second metal layer, disposed on the second nitride semiconductor layer such that an entirety of a bottom of the second metal layer is located on a top surface of the second nitride semiconductor layer; and
a dielectric layer, disposed between the first metal layer and the second nitride semiconductor layer and/or between the second metal layer and the second nitride semiconductor layer,
wherein the thickness of the dielectric layer does not exceed 2 nm,
wherein the dielectric layer is in contact with an entirety of a sidewall and a bottom of the first metal layer and the second nitride semiconductor layer and in contact with the entirety of the bottom of the second metal layer, and wherein the first metal layer and the second metal layer are independent of each other, and a top surface of the first metal layer is coplanar with a top surface of the dielectric layer.

2. The nitride semiconductor device of claim 1, wherein the material of the dielectric layer comprises $Al_2O_3$, SiN, $SiO_2$ or a combination thereof.

3. The nitride semiconductor device of claim 1, wherein the material of the first metal layer comprises Ti, Al or a combination thereof.

4. The nitride semiconductor device of claim 1, wherein the material of the second metal layer comprises TiN, Au, Ni or a combination thereof.

5. The nitride semiconductor device of claim 1, wherein the material of the first nitride semiconductor layer comprises GaN.

6. The nitride semiconductor device of claim 1, wherein the material of the second nitride semiconductor layer comprises AlGaN.

7. The nitride semiconductor device of claim 1, further comprising a third nitride semiconductor layer disposed between the dielectric layer and the second nitride semiconductor layer and located below the second metal layer.

8. The nitride semiconductor device of claim 7, wherein the material of the third nitride semiconductor layer comprises doped GaN.

9. The nitride semiconductor device of claim 1, wherein the bottom surface of the first metal layer is located in the first nitride semiconductor layer or at the interface between the first nitride semiconductor layer and the second nitride semiconductor layer, and the dielectric layer is further located between the first metal layer and the first nitride semiconductor layer.

10. A manufacturing method of a nitride semiconductor device, comprising:
forming a first nitride semiconductor layer on a substrate;
forming a second nitride semiconductor layer on the first nitride semiconductor layer;
forming a trench in the second nitride semiconductor layer;
forming a dielectric layer on the bottom surface and the sidewall of the trench and/or on the top surface of the second nitride semiconductor layer;
forming a first metal layer in the trench; and
forming a second metal layer on the top surface of the second nitride semiconductor layer such that an entirety of a bottom of the second metal layer is located on the top surface of the second nitride semiconductor layer,
wherein the thickness of the dielectric layer does not exceed 2 nm,
wherein the dielectric layer is in contact with an entirety of a sidewall and a bottom of the first metal layer and the second nitride semiconductor layer and in contact with the entirety of the bottom of the second metal layer, and wherein the first metal layer and the second metal layer are independent of each other, and a top surface of the first metal layer is coplanar with a top surface of the dielectric layer.

11. The manufacturing method of a nitride semiconductor device of claim 10, wherein the material of the dielectric layer comprises $Al_2O_3$, SiN, $SiO_2$ or a combination thereof.

12. The manufacturing method of a nitride semiconductor device of claim 10, wherein the material of the first metal layer comprises Ti, Al or a combination thereof.

13. The manufacturing method of a nitride semiconductor device of claim 10, wherein the material of the second metal layer comprises TiN, Au, Ni or a combination thereof.

14. The manufacturing method of a nitride semiconductor device of claim 10, wherein the material of the first nitride semiconductor layer comprises GaN.

15. The manufacturing method of a nitride semiconductor device of claim 10, wherein the material of the second nitride semiconductor layer comprises AlGaN.

16. The manufacturing method of a nitride semiconductor device of claim 10, further comprising forming a third nitride semiconductor layer on the top surface of the second nitride semiconductor layer after forming the second nitride semiconductor layer and before forming the dielectric layer.

17. The manufacturing method of a nitride semiconductor device of claim 16, wherein the material of the third nitride semiconductor layer comprises doped GaN.

18. The manufacturing method of a nitride semiconductor device of claim 10, wherein the bottom surface of the trench is located in the first nitride semiconductor layer or at the interface between the first nitride semiconductor layer and the second nitride semiconductor layer.

* * * * *